(12) United States Patent
Liu et al.

(10) Patent No.: US 6,392,924 B1
(45) Date of Patent: May 21, 2002

(54) ARRAY FOR FORMING MAGNETORESISTIVE RANDOM ACCESS MEMORY WITH PSEUDO SPIN VALVE

(75) Inventors: Chih-Cheng Liu, Taipei; Der-Yuan Wu, Hsin-Chu, both of (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/828,376

(22) Filed: Apr. 6, 2001

(51) Int. Cl.$^7$ .............................................. G11C 11/00
(52) U.S. Cl. ..................... 365/158; 365/171; 365/173
(58) Field of Search ............................... 365/158, 171, 365/173

(56) References Cited

U.S. PATENT DOCUMENTS 6,104,633 A * 8/2000 Abraham et al. ............ 365/171
6,134,138 A * 10/2000 Lu et al. ..................... 365/158
6,175,525 B1 * 1/2001 Fulkerson et al. ........... 365/158
6,317,359 B1 * 11/2001 Black et al. ................. 365/171

* cited by examiner

Primary Examiner—Trong Phan
(74) Attorney, Agent, or Firm—Powell, Goldstein, Frazer & Murphy LLP

(57) ABSTRACT

The array includes: a plurality of pseudo spin valve (PSV) cells; a plurality of parallel bit lines, wherein a plurality of bit lines are straight lines and located under the plurality of pseudo spin valve (PSV) cells; a plurality of parallel word lines, wherein a plurality of word lines are continuous-bended lines having a first straight line, a second straight line and a third straight line. These straight lines of the word lines are orthogonal each other, wherein the first straight line and the third straight line are parallel. The first straight line and the third straight line are individually orthogonal with the direction of the bit lines. Furthermore, the second straight lines of the word lines are individually located on the pseudo spin valve (PSV) cells, and the second straight lines are parallel with the direction of the bit lines, so as to increase the magnetresistance ratio.

22 Claims, 6 Drawing Sheets

ARRAY FOR FORMING MAGNETORESISTIVE RANDOM ACCESS MEMORY WITH PSEUDO SPIN VALVE

BACKGROUND OF THE INVENTION

1. Field of the Invention

The present invention relates generally to a method for forming a magnetoresistance random access memory (MRAM), and more particularly to a method for forming magnetoresistance memory random access memory with a pseudo spin valve (PSV).

2. Description of the Prior Art

As semiconductor devices become highly integrated, the area occupied of the chip has to be maintained or more less, so as to reduce the unit cost of the circuit. For corresponding with the development of the high technology industry in the future, there is only one method to achieve this objective, that is, the area occupied by the devices shrinks, as well as the design rule. With advances in the semiconductor technology, the dimensions of the integrated circuit (IC) devices have been shrunk to the deep sub-micron range. As the semiconductor device continuously shrinks to deep sub-micron region, some problems are incurred due to the process of scaling down.

There are many types of memories in the VLSI arena. Recently, magnetoresistive random access memory (MRAM) cells suitable for fabrication using current integrated circuit manufacturing processes have been developed for use as non-volatile storage elements. Magnetoresistive random access memory (MRAM) is based on the integration of Silicon CMOS with magnetic memory elements. Magnetoresistive random access memory (MRAM) is nonvolatile and has unlimited read and write endurance. Unlike DRAM, magnetic memory cells that store information as the orientation of magnetization of a ferromagnetic region can hold stored information for long periods of time, and are thus nonvolatile. Certain types of magnetic memory cells that use the magnetic state to alter the electrical resistance of the materials near the ferromagnetic region are collectively known as magnetoresistive (MR) memory cells. An array of magnetic memory cells is often called magnetic RAM or MRAM.

The two most viable magnetoresistive random access memory (MRAM) technologies are the pseudo spin valve (PSV) and the magnetic tunnel junction (MTJ) approaches. Recent advances in giant magnetoresistance (GMR) and magnetic tunnel junction (MTJ) materials give magnetoresistive random access memory the potential for high speed, low operating voltage, and high density. The two kinds of Current-In-Plane (CIP) giant magnetoresistance structures we considered are the spin valve and the pseudo spin valve (PSV). In the spin valve memory element, one of the magnetic layers is pinned while the other layer is free to change polarization, this free layer stores the information based on the direction of magnetic polarization with respect to the pinned layer. In this architectire, the resistance of the GMR storage element is compared with a reference cell to determine the state of the memory.

The pseudo spin valve structure consists of two magnetic layers of different thickness with Cu as an interlayer. The different thickness magnetic layers have different switching fields due to the shape anisotropy at submicron dimensions. The magnetic moments of the two magnetic layers can be predominantly anti-parallel or parallel, making the resistance of the film high or low respectively. A typical PSV memory cell stores information in the two possible polarization states of the thick magnetic layer. The bit is read non-destructively by applying a sense current together with a negative and then a positive digit current. The digit current magnitude is chosen such that the magnetic field generated by the digit current and the sense current combined is enough to switch the thin magnetic layer, but not enough to switch the thick magnetic layer.

The magnetoresistive random access memory array of conventional magnetoresistive memory cells is shown in FIG. 1A. The array includes a set of electrically conductive traces that function as parallel word lines 110A, 110B, and 110C in a horizontal plane, and a set of electrically conductive traces that function as parallel bit lines 120A, 120B, and 120C in another horizontal plane. The bit lines are oriented in a different direction, preferably at right angles to the word lines, so that the two sets of lines intersect when viewed from above, as shown in FIG. 1B. A memory cell, such as typical memory cell 130 shown in detail in FIG. 1C, is located at each crossing point of the word lines 110A, 110B, and 110C and bit lines 120A, 120B, and 120C in the intersection region vertically spaced between the lines. The memory cell 130 is arranged in a vertical stack that includes a pseudo spin valve (PSV) 140. The pseudo spin valve (PSV) 140 comprises a vertical stack of a pinned layer 150 having a non-variational direction of magnetization, a free layer 160 having a variational direction of magnetization and an interlayer 170 between the pinned layer 150 and the free layer 160.

During operation of the array, non-uniform magnetization at both ends and at trapped vortices, provides additional torque to facilitate the reversal process, therefore, the switching field is lowered. In the PSV type of memory, magnetization orientations of both the soft and hard layers needs to be reversed for read and write operation, respectively. For read the operation, the amplifier is first auto-zeroed, then the sense current is applied to the stack of active and reference bits while a negative digit current is applied to the active memory bit. The sense surrents remain on while the digit current is switched to the positive direction and the output of the amplifier is strobed. The bit information is determined by detecting the change in signal magnitude between the active bit cell and the reference cell.

Nevertheless, some of the issues result from this traditional structure. The traditional pseudo spin valve MRAM consists of orthogonal bit line and word line, as shown in FIG. 1B. In write mode, the thick magnetic layer is polarization between the induce field by bit line and word line. Therefore, it is necessary that a larger magnetic field is induced to form magnetoresistance, that is, there is a smaller magnetoresistance ratio (delta R) in the conventional pseudo spin valve MRAM. Furthermore, the higher writing current is also required. Accordingly, only field align to bit lines strip can make a strong magnetoresistance.

In accordance with the above description, a new and improved method for forming the cell of the magnetoresistive random access memory is therefore necessary, so as to raise the yield and quality of the follow-up process.

SUMMARY OF THE INVENTION

In accordance with the present invention, a method is provided for fabricating the magnetoresistive random access memory with the magnetic tunnel junction that substantially overcomes drawbacks of above mentioned problems arised from the conventional methods.

Accordingly, it is a main object of the present invention to provide a method for fabricating the magnetoresistive random access memory. This invention can form a novel array of the magnetoresistive random access memory to substitute for conventional structure, so as to obtain a good magnetiresistance performance. Hence, the present invention is appropriate for deep sub-micron technology to provide the semiconductor devices.

Another object of the present invention is to provide a method for forming a pseudo spin valve (PSV) of the magnetoresistive random access memory. The present invention can form a word line strip that is located on the pseudo spin valve cell to parallel the bit line, so as to induce a larger magnetic field to form magnetoresistance, that is, there is a larger magnetoresistance ratio (delta R) in the present invention. Therefore, the low writing current is required in this invention. Accordingly, this invention can provide a magnetoresistive random access memory that has a good magnetiresistance performance to increase yield and quality of the process and, hence, decrease cost. Therefore, the present invention can correspond to economic effect.

In accordance with the present invention, a new method for forming a magnetoresistive random access memory is disclosed. The array includes: a plurality of pseudo spin valve (PSV) cells having a vertical stack that consists of a pinned layer, a interlayer and a free layer; a plurality of electrically conductive traces that function as parallel bit lines in a horizontal plane, wherein a plurality of bit lines are straight lines and located under the pinned layers of a plurality of pseudo spin valve (PSV) cells; a plurality of electrically conductive traces that function as parallel word lines in another horizontal plane, wherein a plurality of word lines are continuous-bended lines having a first straight line, a second straight line and a third straight line. These straight lines of the word lines are orthogonal each other, wherein the first straight line and the third straight line are parallel. The first straight line and the third straight line are individually orthogonal with a direction of one of the bit lines. Furthermore, the second straight lines of the word lines are individually located on the free layers of the pseudo spin valve (PSV) cells, and the second straight lines are parallel with the direction of the bit lines to increase the magnetresistance ratio.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Preferred embodiments of the present invention will now be described in greater detail. Nevertheless, it should be recognized that the present invention can be practiced in a wide range of other embodiments besides those explicitly described, and the scope of the present invention is expressly not limited except as specified in the accompanying claims.

Figure 1A:
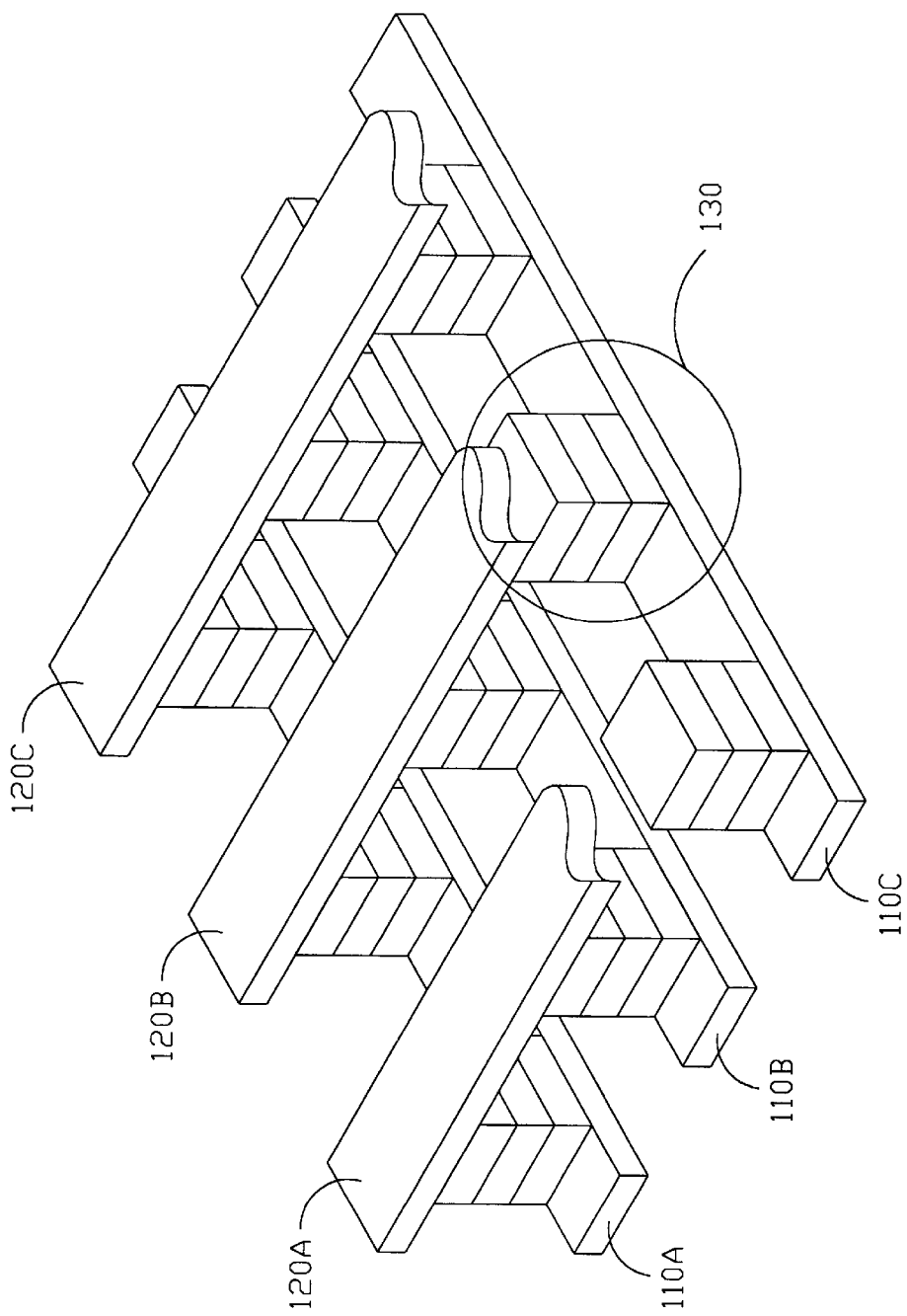
FIG. 1A shows a three-dimensional view illustrative of the structure of the conventional magnetoresistance random access memory having conventional pseudo spin valve.
Figure 1B:
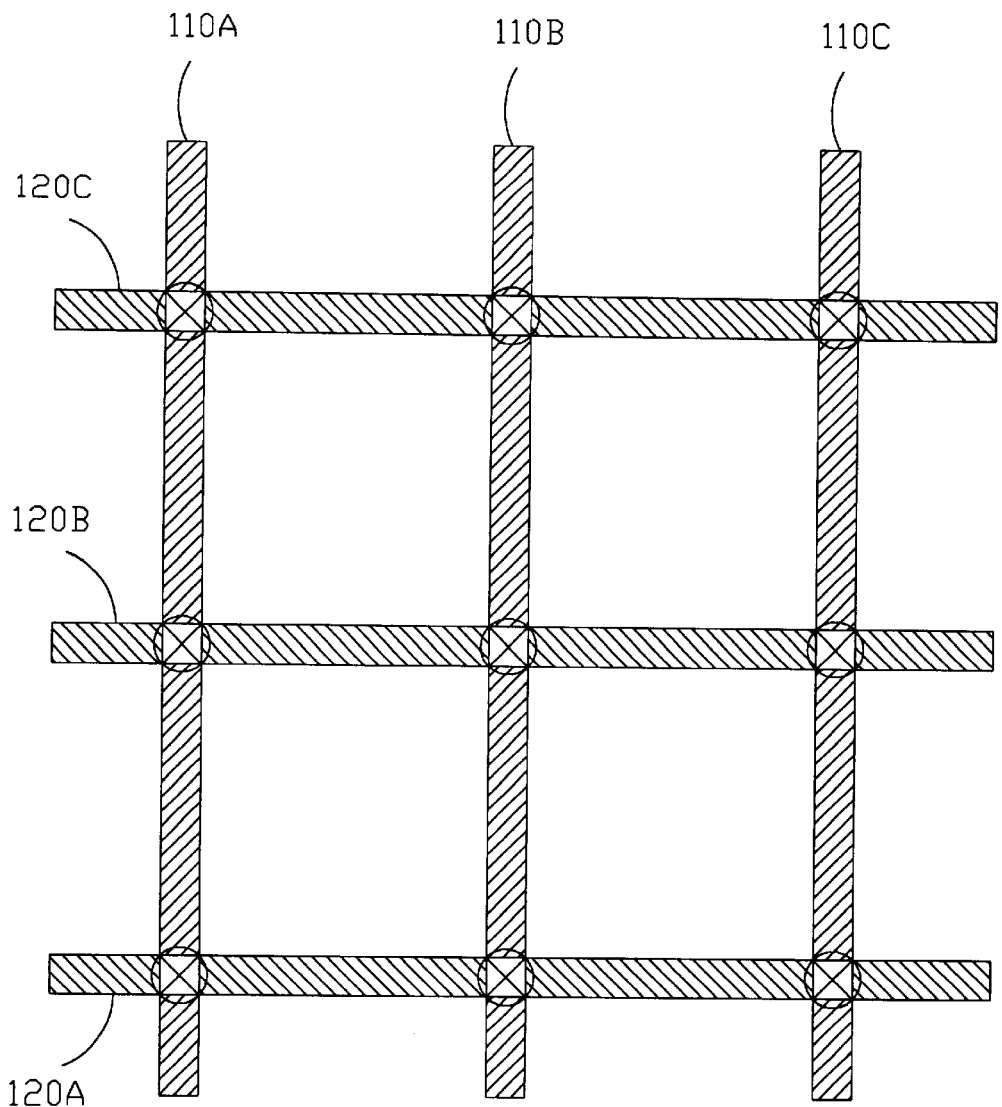
FIG. 1B shows a vertical view illustrative of the array of the conventional magnetoresistance random access memory.
Figure 1C:
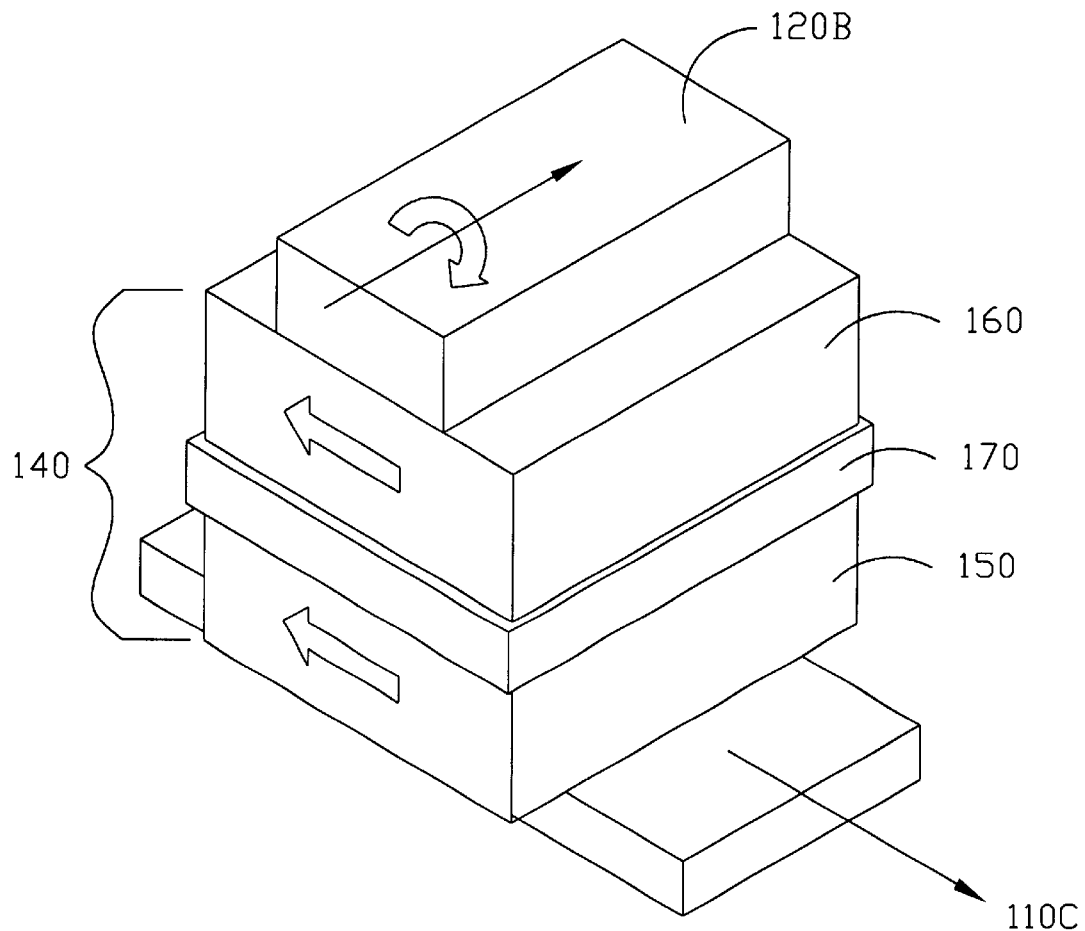
FIG. 1C shows a vertical view illustrative of the structure of the conventional pseudo spin valve cell.
Figure 2:
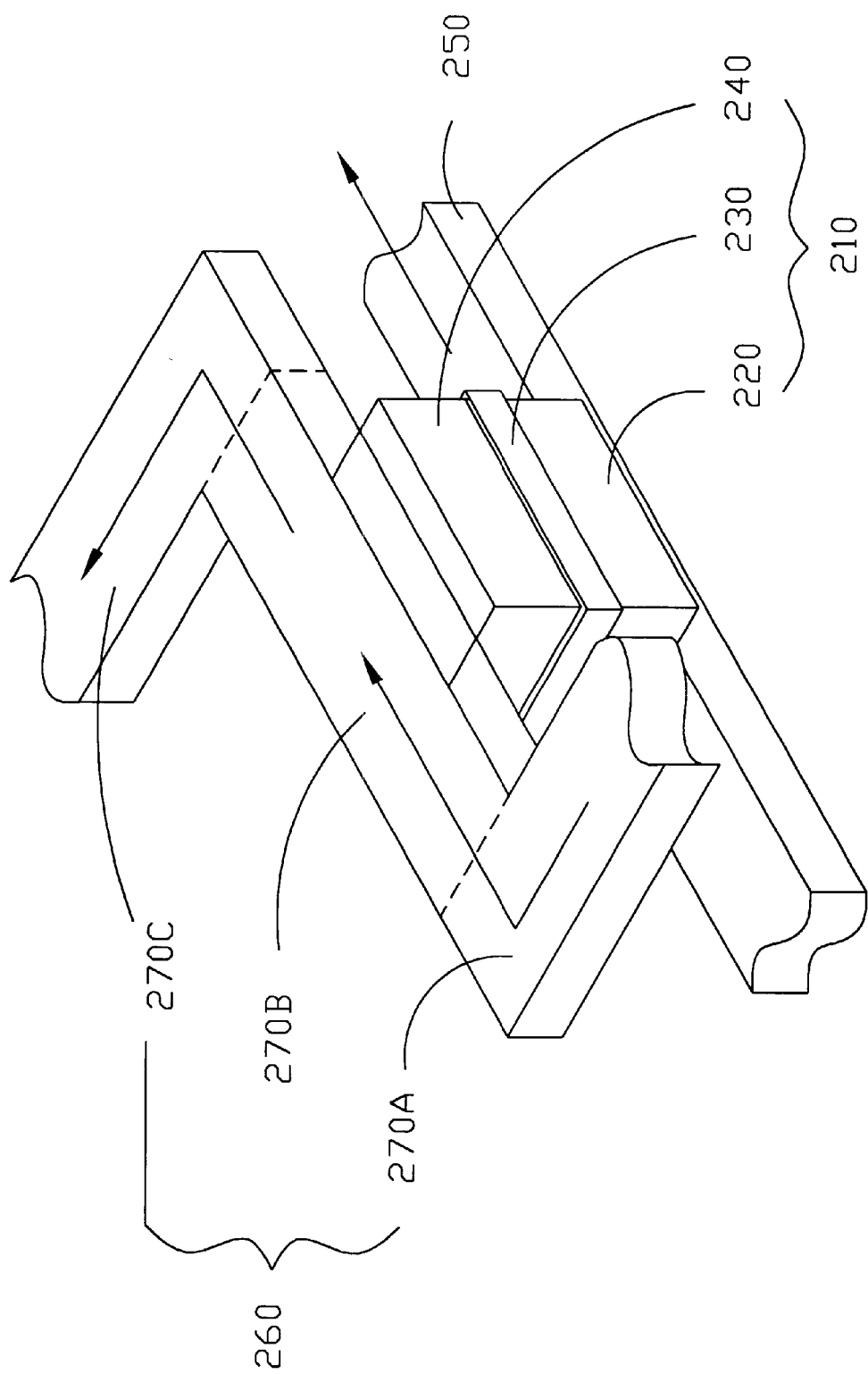
FIG. 2 shows cross-sectional view illustrative of the structure of a magnetoresistance random access memory having a pseudo spin valve in accordance with the first embodiment of the present invention.

As illustrated in FIG. 2, in the first embodiment of the present invention, first of all, a pseudo spin valve (PSV) 210 having a stack structure is provided. The stack structure comprises: a pinned layer 220 having multi-layers that are magnetizable material, such as Ni, Co and Fe alloy, wherein the direction of polarization of the pinned layer 220 is fixed; an interlayer 230 is connected with top of the pinned layer 220, wherein the material of the interlayer 230 is a metal material, such as copper (Cu); a free layer 240 having multi-layers that are magnetizable material, such as Ni, Co and Fe alloy, is connected with top of the interlayer 230, wherein the direction of polarization of the free layer 240 is variable.

In a horizontal plane of the pinned layer 220, a first electrically conductive line 250 that function as a bit line is located under the pinned layer, wherein the first electrically conductive line 250 is a straight line to parallel with the pseudo spin valve 210. In another horizontal plane of the free layer 240, a second electrically conductive line 260 that function as a word line, wherein the second electrically conductive line 260 is a continuous-bended line, such as Z-type line, that comprises a first line segment 270A, a second line segment 270B and a third line segment 270C, wherein the second line segment 270B individually connects with the first line segment 270A and the third line segment 270C. The first line segment 270A and the third line segment 270C individually crisscross with the direction of the first electrically conductive line 250, and the first line segment 270A and the third line segment 270C are parallel each other. The second line segment 270B is located on the free layer 240 of the pseudo spin valve 210, and the second line segment 270B is parallel with the direction of the first electrically conductive line 250, so as to increase the magnetresistance ratio.

Figure 3A:
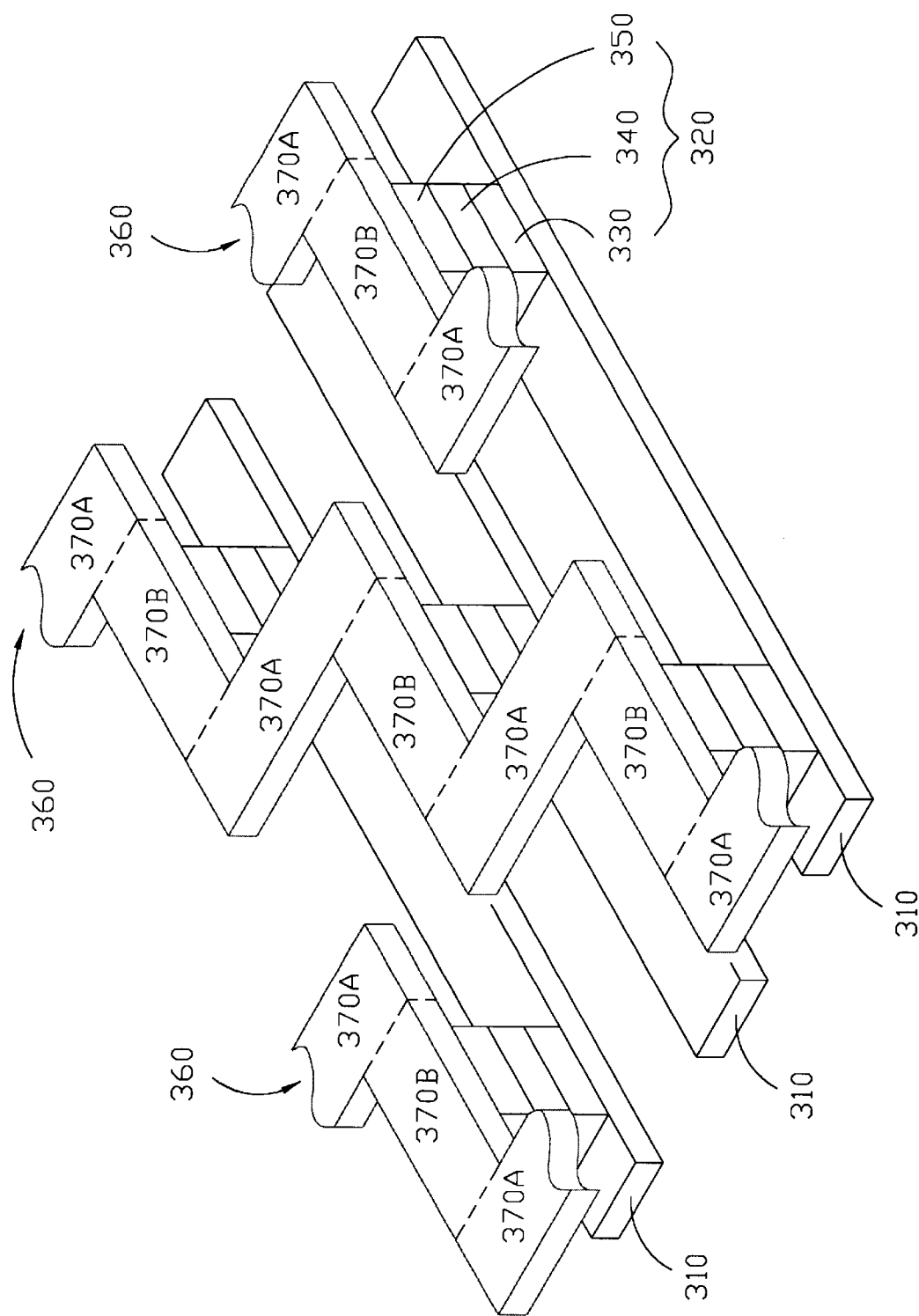
FIG. 3A and FIG. 3B show cross-sectional view illustrative of the array of a magnetoresistance random access memory having a pseudo spin valve in accordance with the second embodiment of the present invention.
Figure 3B:
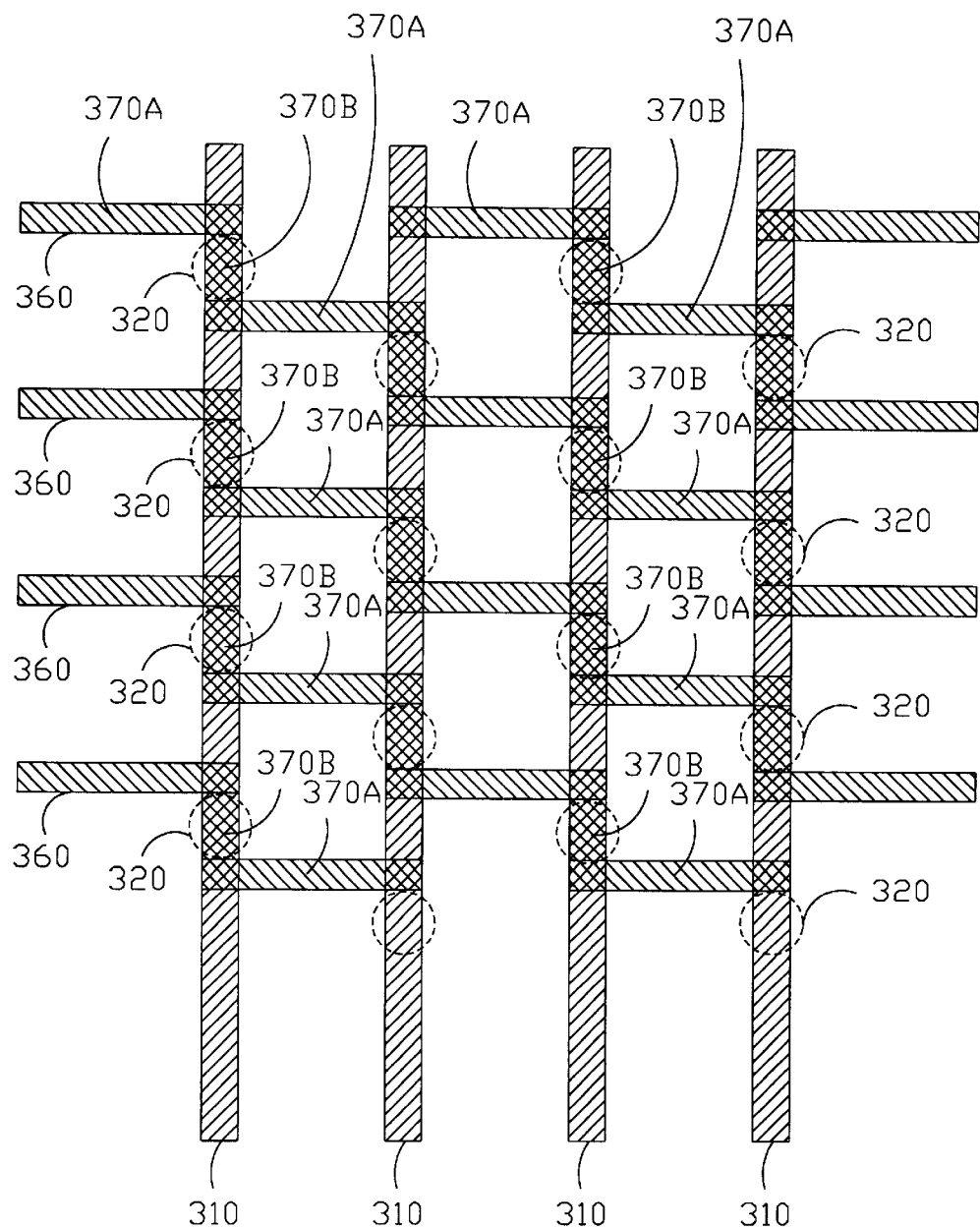

As illustrated in FIG. 3A and FIG. 3B, in the second embodiment of the present invention, first of all, a plurality of parallel bit lines 310 is provided in the first horizontal plane, wherein the plurality of bit lines 310 are straight lines. Then a plurality of pseudo spin valve (PSV) cells 320 having a stack structure are formed on the plurality of bit lines 310. Each pseudo spin valve (PSV) cell 320 comprises: a pinned layer 330 having multi-layers that are magnetizable material, such as Ni, Co and Fe alloy, is formed on the bit line 310, wherein the direction of polarization of the pinned layer 330 is fixed; an interlayer 340 is formed on top of the pinned layer 330, wherein the material of the interlayer 340 is a material of copper (Cu); a free layer 350 having multi-layers that are magnetizable material is formed on top of the interlayer 340, such as Ni, Co and Fe alloy, wherein the direction of polarization of the free layer 350 is variable.

Afterward, in the second horizontal plane, a plurality of word lines 360 are formed on the plurality of free layers 320 of the plurality of pseudo spin valve cells 320. Each word line 360 is a continuous-bended line as a ladder, wherein the word line 360 is consisted of the first line segment 370A and the second line segment 370B. The first line segment 370A is orthogonal and connected with the second line segment 370B each other. The first line segment 370A of the word line 360 is orthogonal with the direction of the bit line 310. furthermore, the second line segment 370B of the word line 360 is parallel with the bit line 310 and located on the free layer 350 of the free layer 350 of the pseudo spin valve cell 320, so as to increase the magnetresistance ratio.

In this embodiment of the present invention, as discussed above, this invention can provide a method for fabricating the magnetoresistive random access memory. This invention can form a novel array of the magnetoresistive random access memory to substitute for conventional structure, so as to obtain a good magnetiresistance performance. Hence, the present invention is appropriate for deep sub-micron technology to provide the semiconductor devices. Moreover, the present invention can form a word line strip that is located on the pseudo spin valve cell to parallel with the bit line, so as to induce a larger magnetic field to form magnetoresistance, that is, there is a larger magnetoresistance ratio (delta R) in the present invention, as shown in FIG. 3B. On the other hand, because the low writing current is required in this invention, this invention can provide a magnetoresistive random access memory that has a good magnetiresistance performance to increase yield and quality of the process and, hence, decrease cost. In other wards, the present invention can correspond to economic effect.

Of course, it is possible to apply the present invention to the process for forming the pseudo spin valve cell, and also it is possible to the present invention to any one magnetoresistive random access memory devices in the semiconductor devices. Also, this invention can be applied to use one line segment of the word line that is parallel with the bit line concerning the array of the magnetoresistive random access memory used for inducing a larger magnetic field and decreasing writing current have not been developed at present. Method of the present invention is the best magnetoresistive random access memory compatible process for deep sub-micro process.

Obviously, many modifications and variations of the present invention are possible in light of the above teachings. It is therefore to be understood that within the scope of the appended claims, the present invention may be practiced otherwise than as specifically described herein.

Although specific embodiments have been illustrated and described, it will be obvious to those skilled in the art that various modifications may be made without departing from what is intended to be limited solely by the appended claims.

What is claimed is:

1. An array of a pseudo spin valve of a magnetoresistive random access memory, said array comprising:
    a first conducting line;
    a pseudo spin valve cell, wherein said pseudo spin valve cell is located on said first conducting line; and
    a second conducting line that is located on said pseudo spin valve cell, said second conducting line includes a continuous-bended line having a first line segment, a second line segment that is located on said pseudo spin valve cell and a third line segment that is parallel with said first line segment, wherein said first line segment and said third line segment individually connects with said second line segment, and said first line segment and said third line segment individually crisscross with the direction of said first conductive line, and said second line segment is parallel with the direction of said first conducting line.

2. The array according to claim 1, wherein said first conducting line comprises a bit line.

3. The array according to claim 1, wherein said pseudo spin valve cell comprises a stack structure.

4. The array according to claim 3, wherein said stack structure comprises:
    a pinned layer having multi-layers that are magnetizable material, wherein said pinned layer is located on said first conductive line;
    an interlayer, wherein said interlayer is connected with the top of said pinned layer; and
    a free layer having multi-layers that are magnetizable material connects with the top of said interlayer, wherein said free layer is located under said second line segment of said second conducting line.

5. The array according to claim 4, wherein said pinned layer comprises a fixed direction of polarization.

6. The array according to claim 4, wherein said interlayer comprises a metal material.

7. The array according to claim 4, wherein said free layer comprises a variable direction of polarization.

8. The array according to claim 1, wherein said second conducting line comprises a word line.

9. An array of a magnetoresistive random access memory having a plurality of pseudo spin valve cells, said array comprising:
    a plurality of first conducting lines that are parallel each other;
    a plurality of pseudo spin valve cells, wherein said plurality of pseudo spin valve cells are located on said first conducting line; and
    a plurality of second conducting lines having a plurality of continuous-bended lines as ladder are located on said plurality of pseudo spin valve cells, wherein the line segments of said plurality of second conducting line across said plurality of pseudo spin valve cells are parallel with the direction of said plurality of first conducting lines, so as to increase the magnetresistance ratio.

10. The array according to claim 9, wherein said plurality of first conducting line comprise a bit line.

11. The array according to claim 9, wherein said plurality of pseudo spin valve cells comprise a plurality of stack structures.

12. The array according to claim 11, wherein said a plurality of stack structures comprises:
    a plurality of pinned layers having multi-layers that are magnetizable material, wherein said plurality of pinned layers are located on said plurality of first conductive lines;
    a plurality of interlayers, wherein said plurality of interlayers are connected with the top of said plurality of pinned layers; and
    a plurality of free layers having multi-layers that are magnetizable material connect with the top of said plurality of interlayers, wherein said plurality of free layers are located under said plurality of second conducting lines.

13. The array according to claim 12, wherein said plurality of pinned layers comprise a fixed direction of polarization.

14. The array according to claim 12, wherein said plurality of interlayers comprise a metal material.

15. The array according to claim 14, wherein said metal material comprises a copper material.

16. The array according to claim 12, wherein said plurality of free layers comprise a variable direction of polarization.

17. The array according to claim 9, wherein said plurality of second conducting lines comprise a word line.

18. The array according to claim 9, wherein the line segments of said plurality of second conducting lines that do not across said plurality of pseudo spin valve cells crisscross with the direction of said plurality of first conducting lines.

19. An array of a magnetoresistive random access memory for increasing the magnetresistance ratio, said array comprising:

a plurality of bit lines that are parallel each other;

a plurality of pinned layers that are located on said plurality of bit lines;

a plurality of interlayers, wherein said plurality of interlayers connect with the top of said plurality of pinned layers;

a plurality of free layers, wherein said plurality of free layers connect with the top of said plurality of interlayers; and a plurality of word lines that are parallel each other, said plurality of word lines are a plurality of continuous-bended lines as ladder and individually located on said plurality of free layers, wherein said plurality of word lines consist of a first line segment that are ont across said plurality of said free layers and a second line segment across said plurality of said free layers, said first line segment is orthogonal and connected with said second line segment each other, and said first line segment is with the direction of said bit line, and second line segment is parallel with the direction of said bit line, so as to increase the magnetresistance ratio.

20. The array according to claim 19, wherein said plurality of pinned layers comprise a fixed direction of polarization.

21. The array according to claim 19, wherein said plurality of interlayers comprises a copper material.

22. The array according to claim 19, wherein said plurality of free layers comprise a variable direction of polarization.

* * * * *